United States Patent [19]
Frindle

[11] Patent Number: 5,148,163
[45] Date of Patent: Sep. 15, 1992

[54] DIGITAL TO ANALOG CONVERSION CIRCUIT WITH DITHER AND OVERFLOW PREVENTION

[75] Inventor: Paul Frindle, Charlbury, England

[73] Assignee: Sony Corporation, Tokyo, Japan

[21] Appl. No.: 765,268

[22] Filed: Sep. 25, 1991

[30] Foreign Application Priority Data

Nov. 15, 1990 [GB] United Kingdom ............... 9024819

[51] Int. Cl.$^5$ ............................................ H03M 1/20
[52] U.S. Cl. .................................... 341/131; 341/144
[58] Field of Search .......................... 341/131, 144, 155

[56] References Cited

U.S. PATENT DOCUMENTS

| | | | |
|---|---|---|---|
| 4,864,305 | 9/1989 | Toyama | 341/131 X |
| 4,914,439 | 4/1990 | Nakahashi et al. | 341/131 |
| 4,926,179 | 5/1990 | Yoshioka | 341/144 |
| 4,968,987 | 11/1990 | Naka et al. | 341/143 |

FOREIGN PATENT DOCUMENTS

WO87/06079  10/1987  PCT Int'l Appl.

OTHER PUBLICATIONS

Yamasaki, The Application of Large Amplitude Dither to the Quantization of Wide Range Audio Signals, The Journal of the Acoustical Society of Japan, 1983, vol. 39, #7, pp. 452–462.

*Primary Examiner*—Howard L. Williams
*Attorney, Agent, or Firm*—Alvin Sinderbrand; William S. Frommer

[57] ABSTRACT

In a digital-to-analog conversion system, an input digital signal D is separated by means of an inverter into first and second signal paths, one of which is the inverse of the other. A digital random noise signal R is then added to the direct and inverse signals to form combined digital signals R−D, R+D. The combined signals are converted into analog form by two identical D/A converter devices to provide analog signals R−D+E1, R+D+E2 (E1 and E2 representing the errors introduced in the conversion process), and these are then subtracted to form an analog output 2D−E1+E2. Thus the random noise components are removed from the analog output, and also the errors E1 and E2 tend to cancel each other leading to a reduction in distortion. Moreover, any remaining distortion is randomized and thus harmonic distortion is reduced. When the injected random noise signal has a greater resolution than the converter devices, there is also an overall increase in data resolution.

A similar technique may also be applied to analog-to-digital conversion systems.

16 Claims, 3 Drawing Sheets

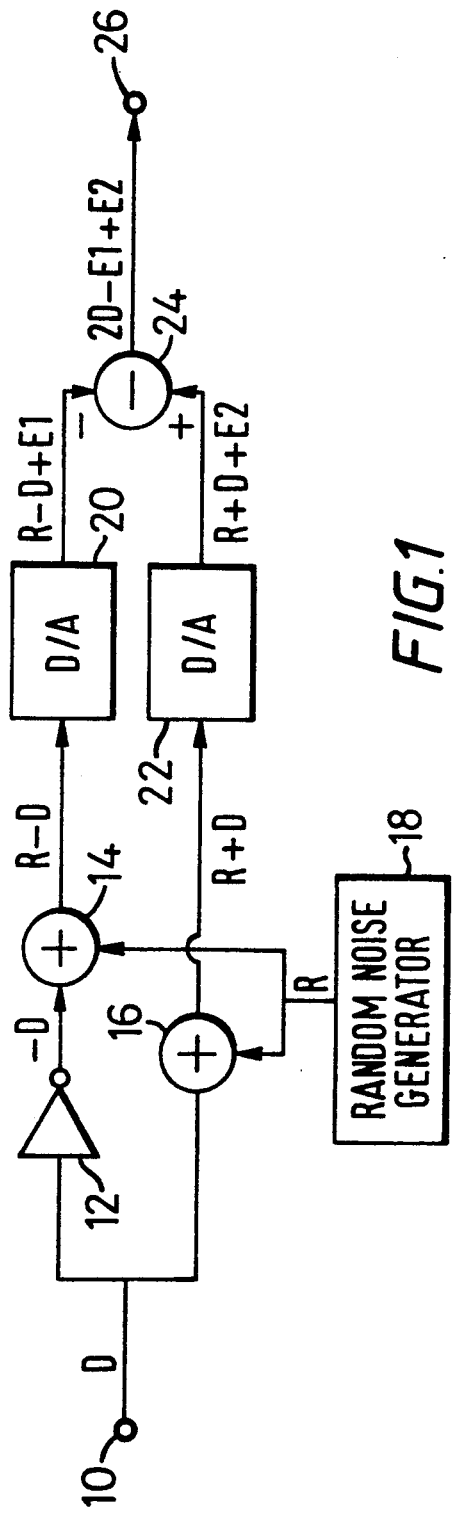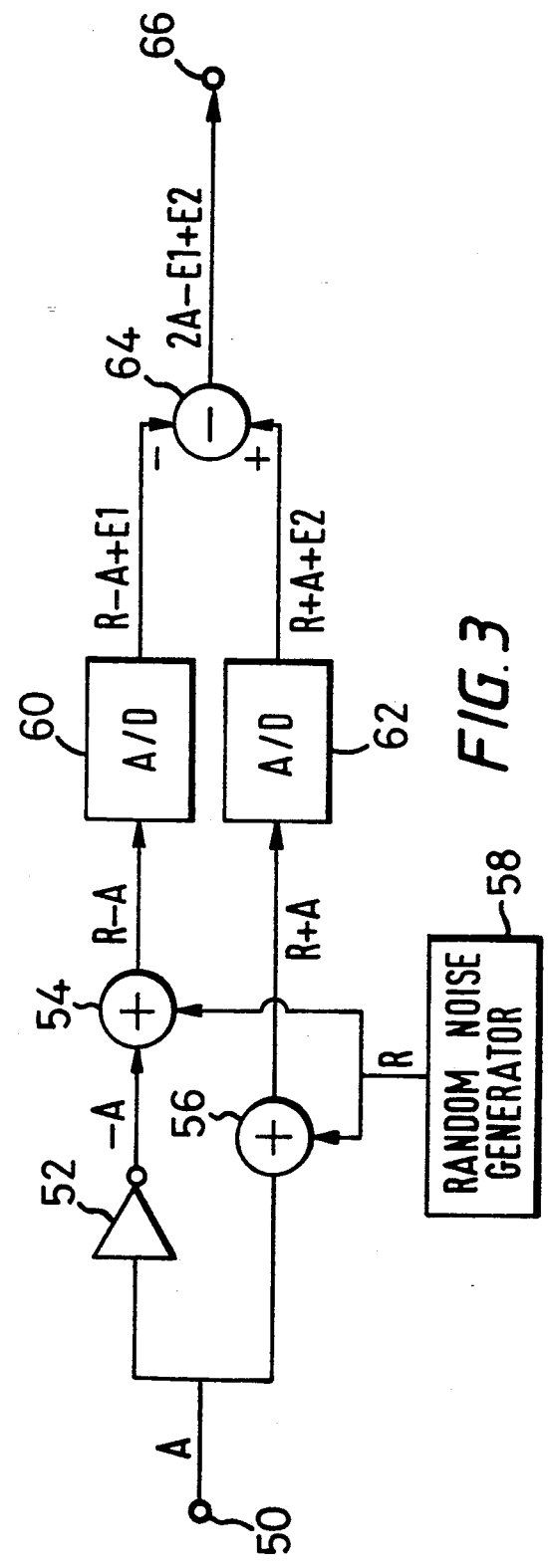

DIGITAL TO ANALOG CONVERSION CIRCUIT WITH DITHER AND OVERFLOW PREVENTION

BACKGROUND OF THE INVENTION

1. Field of the Invention

This invention relates to conversion between analog and digital signals, that is conversion from analog signals to digital signals and vice versa.

2. Description of the Prior Art

Analog to digital (A/D) and digital to analog (D/A) signal conversion are both subject to certain limitations in that either conversion process tends to introduce distortion into the signal being converted. For example, harmonic distortion can be introduced during conversion, in which one or more harmonics (namely frequencies which are multiples of a fundamental frequency component in the signal) appear in the converted signal. This can typically arise as a result of linearity errors in the conversion process, and results in undesired harmonics being introduced into the converted signal. In many applications, such as digital audio signal processing, this source of distortion leads to significant degradation of the signal being processed.

Conversion from analog to digital signals or vice versa is also subject to limitations in resolution. Any conversion device is capable of operating at a certain maximum resolution, and this sets a limit on the data resolution available in the converted signal.

International (PCT) Patent Application Publication No. WO 87/06079 discloses a technique of conversion between analog and digital signals in which a random signal of one (either analog or digital) form is added to the input signal having the same form. The summed signal is converted to the other (either digital or analog) form, and the random signal is also converted to that other form. The converted random signal is then subtracted from the converted summed signal to provide a representation of the input signal in converted form. This technique provides some reduction in the harmonic distortion caused by the analog-to-digital (or vice versa) conversion since the linearity errors of the conversion are randomized. However, the effectiveness of the technique relies on the addition of the random signal in one form being accurately matched by the subtraction of the random signal in the other form, so that the random signal may be effectively eliminated from the converted output signal. In practice, such accurate matching is difficult to achieve.

SUMMARY OF THE INVENTION

It is an object of the present invention to provide a circuit for conversion between analog and digital signals which overcomes the problems encountered in the prior art.

It is another object of the present invention to provide a circuit for conversion between analog and digital signals which produces reduced distortion in the converted signal, in particular reduced harmonic distortion, by compensating for linearity errors arising in the conversion process.

It is a further object of the present invention to provide a circuit for conversion between analog and digital signals which is capable of improving the signal resolution of the converter devices used in the conversion process.

According to one aspect of the present invention there is provided a circuit for converting an input digital signal into an analog representation thereof, the circuit comprising:

means for separating the input digital signal into first and second digital signals;

means for combining a digital random noise signal with each of the first and second digital signals to form respective first and second combined digital signals such that the first combined digital signal represents the sum of the digital random noise signal and the input digital signal, and the second combined digital signal represents the difference between the digital random noise signal and the input digital signal;

means for digital-to-analog converting each of the first and second combined digital signals to form respective first and second converted analog signals; and means for subtracting the first and second converted analog signals so as to remove the random noise signal components thereof and to provide an analog representation of the input digital signal.

According to another aspect of the present invention there is provided a circuit for converting an input analog signal into a digital representation thereof, the circuit comprising:

means for separating the input analog signal into first and second analog signals;

means for combining an analog random noise signal with each of the first and second analog signals to form respective first and second combined analog signals such that the first combined analog signal represents the sum of the analog random noise signal and the input analog signal, and the second combined analog signal represents the difference between the analog random noise signal and the input analog signal;

means for analog-to-digital converting each of the first and second combined analog signals to form respective first and second converted digital signals; and means for subtracting the first and second converted digital signals so as to remove the random noise signal components thereof and to provide a digital representation of the input analog signal.

In preferred embodiments of the invention, described in more detail below, the input signal is separated into first and second signals, one of which is the inverse of the other. The random noise signal is then added to both of these separated signals such that one is the sum and the other is the difference between the input signal and the random noise signal. The resulting signals are subsequently applied to two identical conversion system paths comprising, in the case of digital to analog conversion, digital reconstruction filtering and digital-to-analog converters or, in the case of analog to digital conversion, analog-to-digital converters. The outputs of both the conversion system paths are then summed in antiphase to recover the original signal in the converted form, and to remove the subsequently applied random noise signal.

One advantage of the preferred conversion systems is that distortion is reduced. The linearity errors of the converter that cause harmonic distortion are randomized and therefore, in audio signal processing, lose any audible relationship to the input signal. The harmonic distortions in the amplitude range of the injected random noise signal are thus effectively removed. The characteristic nonlinearities common to both the converter devices are also reduced by the action of the inverted signal operation (whereby the input signal component in one conversion path is the inverse of that in the other) causing a measure of compensation between devices.

Another advantage is that signal resolution can be improved. The use of addition of the random noise signal at a greater resolution than that of the converter devices enables the inclusion of more data resolution in the resulting converted signal. Since the final signal-to-noise ratio of the system is proportional to the extent to which the injected random noise signal has been removed, in the case of a converter device with more accuracy than resolution, a gain in total dynamic range can be obtained in addition to greater resolution and reduced harmonic distortion.

The above, and other objects, features and advantages of this invention will be apparent from the following detailed description of illustrative embodiments which is to be read in connection with the accompanying drawings.

BRIEF DESCRIPTION OF THE DRAWINGS

FIG. 1 is a schematic block diagram of a digital-to-analog conversion system according to one embodiment of the present invention;

FIG. 3 is a schematic block diagram of an analog-to-digital conversion system according to another embodiment of the present invention.

DESCRIPTION OF THE PREFERRED EMBODIMENTS

Figure 2:
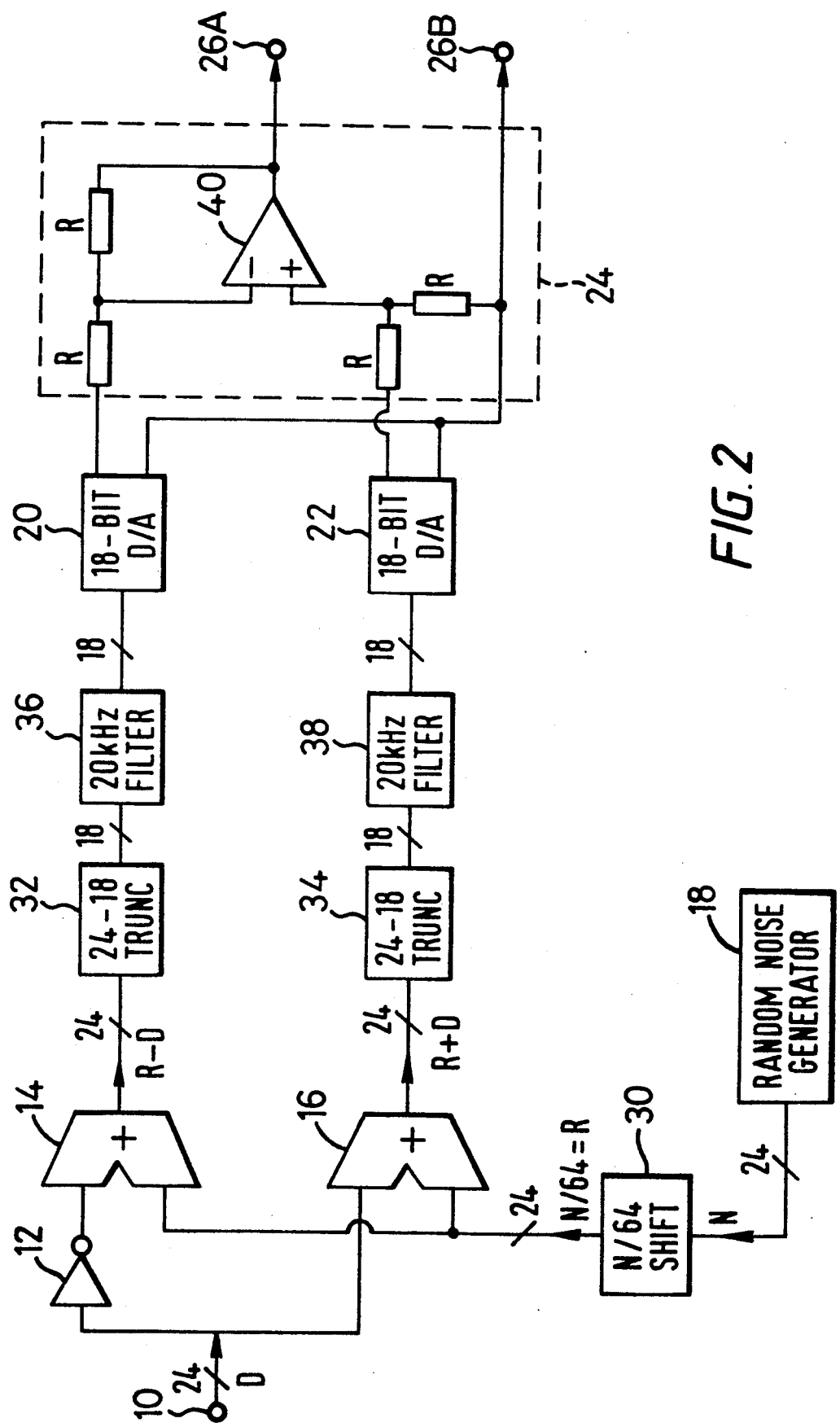
FIG. 2 is a more detailed circuit diagram of one implementation of the conversion system shown in FIG. 1.

Referring to FIG. 1, a digital-to-analog conversion system includes an input 10 for a digital signal D which is connected, firstly via an inverter 12 to one input of a first adder 14, and secondly directly to one input of a second adder 16. A digital random noise generator 18, generating a random noise signal R, is connected to the other inputs of the first and second adders 14, 16. The outputs of the first and second adders 14, 16 are respectively connected to the inputs of first and second digital-to-analog (D/A) converters 20, 22. The outputs of the first and second D/A converters 20, 22 are respectively connected to inverting and non-inverting inputs of a subtractor 24, and the resulting subtracted signal is supplied to an analog output 26.

In operation, the input digital signal D is inverted by the inverter 12 to form a signal $-D$ (which is the logical inverse of the digital signal D) which is supplied to the first adder 14. The random noise signal R is supplied to both adders 14, 16 whereby the output signal from the first adder 14 is $R-D$, and the output signal from the second adder 16 is $R+D$. During the conversion process in the D/A converters 20, 22, distortion will arise and this may be represented by an error signal E1 for the first D/A converter 20 and by an error signal E2 for the second D/A converter 22. Thus the analog output of the first D/A converter 20 will be $R-D+E1$, and that of the second D/A converter 22 will be $R+D+E2$. When these analog outputs are subtracted by the subtractor 24, the resulting analog output signal is $2D-E1+E2$. Thus the subtractor 24 removes the random noise signal component, and also causes the error signals E1, E2 to counterbalance each other. When the D/A converters 20, 22 are operating over a broadly similar range of values, E1 and E2 will be similar in value whereupon the errors arising from non-linearity distortion will be substantially reduced. Even when some residual error remains, the non-linearity distortion will be randomized as a result of combination of the input data signal with the random noise signal, and the error will therefore not lead to harmonic distortion in the output, which is a significant advantage in certain applications such as audio signal processing.

FIG. 2 shows a specific implementation of the system shown in FIG. 1. The input digital signal D is a 24-bit data signal and is applied, as in FIG. 1, via the inverter 12 to the first adder 14, and directly to the second adder 16. The digital random noise generator 18 produces a 24-bit signal N which is shift divided by 64 by means of a N/64 shift divider 30. The resulting random noise signal $R(=N/64)$ is applied to the adders 14, 16. The circuit of FIG. 2 includes first and second 24-18 truncation circuits 32, 34, and first and second 20 kHz low-pass filters 36, 38 respectively connected between the adders 14, 16 and the 18-bit D/A converters 20, 22. The subtractor 24 for the analog outputs of the D/A converters 20, 22 comprises an operational amplifier 40 connected with four resistors R to form a differential amplifier. The analog output of the subtractor 24 is supplied to output terminals 26A, 26B.

The operation of the circuit of FIG. 2 is broadly similar to that of FIG. 1. The purpose of the shift divider 30 is to set the random noise signal to an optimum level which, in the present case, is six bits lower than full scale, in other words $-36$dB. This is achieved by shift dividing by 64. In general, the level of the shift divided random noise signal R will be greater than the level of the least significant bit of the input digital signal, and less than a level corresponding to the maximum range of the system. The first and second 24-18 truncation circuits 32, 34 truncate the signals $R-D$, $R+D$ from 24 bits to 18 bits. In the embodiment being described, for audio signal processing, the truncated signals are then filtered by the 20 kHz low-pass filters 36, 38 before being applied to the D/A converters 20, 22. The resulting analog signals are then summed in anti-phase by the differential amplifier constituting the subtractor 24 and the recovered data signal is supplied in analog form to the output terminals 26A, 26B, the random noise component having been removed and also with a significant reduction in the error signals introduced by the D/A conversion process.

The circuit shown in FIG. 2 has the same advantage as that of FIG. 1, specifically a reduction in distortion, and in particular harmonic distortion. Also, as a result of injection and addition of an increased resolution signal (24 bits) compared to that of the converter devices (18 bits), increased data resolution in the resulting converted signal can be obtained. The final signal-to-noise ratio of the system is proportional to the extent to which the injected random noise signal is removed, and therefore in the case of converter devices with greater accuracy than resolution, the total dynamic range can be increased in addition to greater resolution and reduced harmonic distortion.

In this way, the circuits of FIGS. 1 and 2 can be used to improve the performance of commercially available D/A converter devices. The paired components used in the direct and inverted signal paths should of course be as close as possible in performance characteristics, in order for the final removal of the random noise components and reduction in distortion to be achieved optimally. Instead of the use of the inverter 12 and the adder 14, it would be possible for a single subtractor to be provided. However, in this case, it would be essential to ensure that the characteristics of the subtractor are capable of providing the difference signal R−D in such a way that this signal is matched closely to the sum signal R+D from the adder 16.

Referring to FIG. 3, an analog-to-digital conversion system includes an input 50 for an analog signal A which is connected, firstly via an analog inverter 52 to one input of a first adder 54, and secondly directly to one input of a second adder 56. An analog random noise generator 58, generating a random noise signal R, is connected to the other inputs of the first and second adders 54, 56. The outputs of the first and second adders 54, 56 are respectively connected to the inputs of first and second analog-to-digital (A/D) converters 60, 62. The digital outputs of the A/D converters 60, 62 are respectively connected to inverting and non-inverting inputs of a digital subtractor 64, and the resulting subtracted signal is supplied to a digital output 66.

The operation of the circuit of FIG. 3 is similar to that of FIG. 1, except that the digital and analog parts of the circuit are changed to analog and digital parts. The input analog signal A is inverted by the analog inverter 52 to form a signal −A which is supplied to the first adder 54. The analog random noise signal R is supplied to both adders 54, 56 whereby the output signal from the first adder 54 is R−A, and the output signal from the second adder is R+A. During the conversion process in the A/D converters 60, 62, distortion will arise and this may be represented by respective error signals E1 and E2. Thus the digital output of the first A/D converter 60 will be R−A+E1, and that of the second A/D converter 62 will be R+A+E2. When these digital outputs are subtracted by the digital subtractor 64, the resulting digital output signal is 2A−E1+E2. Thus, in similar manner to the circuit of FIG. 1, the subtractor 64 removes the random noise signal component, and also causes the error signals E1 and E2 to counterbalance each other. Thus the errors arising from non-linearity distortion introduced in the conversion process will be substantially reduced, and any residual error will be randomized as a result of combination of the input signal with the random noise signal; the error will therefore not lead to harmonic distortion in the output.

Figure 4:
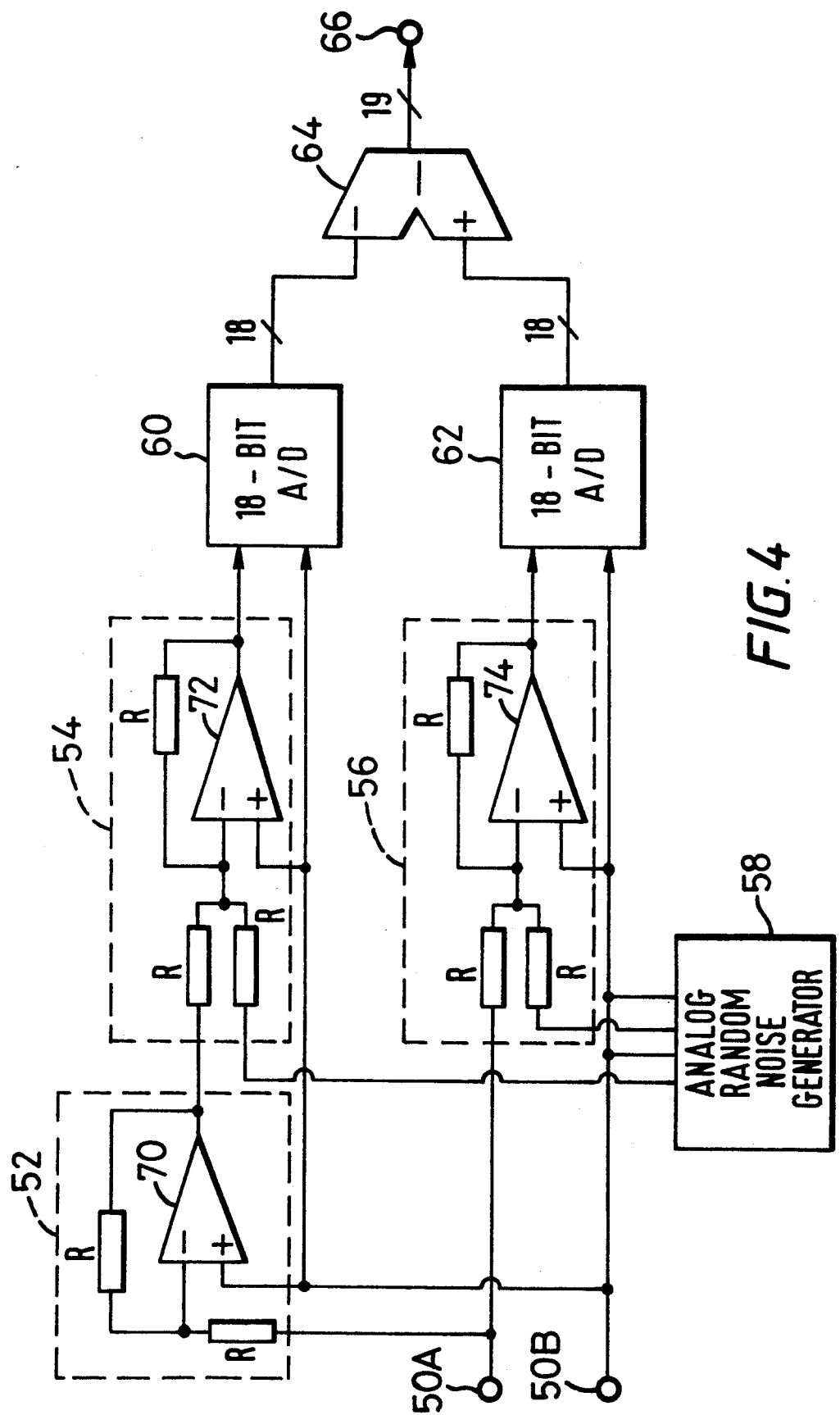
FIG. 4 is a more detailed circuit diagram of one implementation of the conversion system shown in FIG. 3.

FIG. 4 shows a specific implementation of the system shown in FIG. 3. The input analog signal A is applied via input terminals 50A, 50B both to the first adder 54 via the analog inverter 52, and directly to the second adder 56. As shown, the analog inverter 52 is constituted by an operational amplifier 70 connected with two resistors R to form an inverting amplifier. Also, each of the adders 54, 56 is constituted by a respective operational amplifier 72, 74 connected with three resistors R to form an addition circuit. The analog random noise generator 58 supplies the analog random noise signal to the other inputs of the adders 54, 56. The analog random noise generator 58 is shown as having separate outputs from the adders to indicate that these should be suitably buffered to prevent interaction between the adders; however, the random noise signals on each of these outputs must be identical.

The combined signals from each of the adders 54, 56 are respectively supplied to the 18-bit A/D converters 60, 62 and, after digitization, the signals are supplied to the digital subtractor 64 in which the random noise component is removed and distortion is reduced as explained above, and the 19-bit digital output signal is supplied to the output 66.

Instead of the use of the analog inverter 52 and the adder 54 as shown in FIGS. 3 and 4, it would be possible for a single analog subtractor to be provided. However, it would then be essential to ensure that the characteristics of the subtractor are capable of providing a difference signal which is suitably closely matched to the sum signal from the adder 56.

The advantages of the circuit of FIG. 4 are similar to those of FIG. 3, namely that non-linearity errors in each of the conversion paths will tend to cancel out, and also that harmonic distortion will be reduced as a result of randomization of any residual errors. The level of the random noise signal should be optimized with reference to the level of the input analog signal, and this will typically be at −36dB to −70dB referred to the full level, depending on the converter devices, these parameters also applying to the digital-to-analog conversion systems of FIGS. 1 and 2.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A circuit for converting an input digital signal having a plurality of bits into an analog representation thereof, the circuit comprising:

means for separating the input digital signal into first and second digital signals;

means for combining a digital random noise signal having a plurality of bits with each of the first and second digital signals to form respective first and second combined digital signals such that the first combined digital signal represents the sum of the digital random noise signal and the input digital signal, and the second combined digital signal represents the difference between the digital random noise signal and the input digital signal;

digital truncating means for reducing the bit number of the first and second combined digital signals to form respective first and second truncated digital signals;

means for digital-to-analog converting each of the first and second truncated digital signals to form respective first and second converted analog signals; and means for subtracting the first and second converted analog signals so as to remove the random noise signal components thereof and to provide an analog representation of the input digital signal.

2. A circuit according to claim 1, wherein the separating means is operable to separate the input digital signal into the first and second digital signals in an inverse manner such that the second digital signal is the inverse of the first digital signal.

3. A circuit according to claim 2, wherein the combining means comprises first adding means for adding the digital random noise signal to the first digital signal to form the first combined digital signal, and second adding means for adding the digital random noise signal to the second digital signal to form the second combined digital signal.

4. A circuit according to claim 1, further comprising random noise generator means for generating the digital random noise signal at a predetermined level.

5. A circuit according to claim 1, further comprising a random noise generator means including a random noise generator and a shift divider means for dividing the output of the random noise generator so as to provide the digital random noise signal at a predetermined level.

6. A circuit according to claim 4, wherein the circuit has an operating range and said predetermined level is greater than the level of the least significant bit of the input digital signal and less than a level corresponding to a maximum of said operating range of the circuit.

7. A circuit according to claim 1, wherein the digital truncating means is operable to reduce the bit number of the first and second combined digital signals from 24 bits to 18 bits.

8. A circuit for converting an input digital signal having a plurality of bits into an analog representation thereof, the circuit comprising:

means for separating the input digital signal into first and second digital signals;

means for combining a digital random noise signal having a plurality of bits with each of the first and second digital signals to form respective first and second combined digital signals such that the first combined digital signal represents the sum of the digital random noise signal and the input digital signal, and the second combined digital signal represents the difference between the digital random noise signal and the input digital signal;

digital filter means for filtering the first and second combined digital signals to form respective first and second filtered digital signals;

means for digital-to-analog converting each of the first and second filtered digital signals to form respective first and second converted analog signals; and means for subtracting the first and second converted analog signals so as to remove the random noise signal components thereof and to provide an analog representation of the input digital signal.

9. A circuit according to claim 8, wherein the digital filter means includes first and second digital 20 kHz low-pass filters.

10. A circuit according to claim 8, wherein said means for separating is operable to separate the input digital signal into the first and second digital signals in an inverse manner such that the second digital signal is the inverse of the first digital signal.

11. A circuit according to claim 10, wherein said means for combining comprises first adding means for adding the digital random noise signal to the first digital signal to form the first combined digital signal, and second adding means for adding the digital random noise signal to the second digital signal to form the second combined digital signal.

12. A circuit according to claim 8, further comprising random noise generator means for generating the digital random noise signal at a predetermined level.

13. A circuit according to claim 12, wherein the circuit has an operating range, and wherein said predetermined level is greater than the level of the least significant bit of the input digital signal and less than a level corresponding to a maximum of said operating range of the circuit.

14. A circuit according to claim 8, further comprising digital truncating means for reducing the bit number of the first and second combined digital signals.

15. A circuit according to claim 14, wherein the digital truncating means is operable to reduce the bit number of the first and second combined digital signals from 24 bits to 18 bits.

16. A circuit according to claim 8, further comprising a random noise generator means including a random noise generator and a shift divider means for dividing the output of the random noise generator so as to provide the digital random noise signal at a predetermined level.

* * * * *